(12) United States Patent
Ebisu et al.

(10) Patent No.: US 11,233,174 B2
(45) Date of Patent: Jan. 25, 2022

(54) SEMICONDUCTOR OPTICAL DEVICE, OPTICAL MODULE, AND MANUFACTURING METHOD OF SEMICONDUCTOR OPTICAL DEVICE

(71) Applicant: Lumentum Japan, Inc., Kanagawa (JP)

(72) Inventors: Masahiro Ebisu, Tokyo (JP); Takayuki Nakajima, Tokyo (JP); Yuji Sekino, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 0 days.

(21) Appl. No.: 16/811,559

(22) Filed: Mar. 6, 2020

(65) Prior Publication Data
US 2020/0287090 A1 Sep. 10, 2020

(30) Foreign Application Priority Data
Mar. 8, 2019 (JP) .............................. JP2019-043177

(51) Int. Cl.
*H01L 33/38* (2010.01)
*H01L 33/46* (2010.01)
*H01L 33/40* (2010.01)

(52) U.S. Cl.
CPC .......... *H01L 33/387* (2013.01); *H01L 33/405* (2013.01); *H01L 33/46* (2013.01)

(58) Field of Classification Search
CPC ...... H01L 33/387; H01L 33/405; H01L 33/46
See application file for complete search history.

(56) References Cited

U.S. PATENT DOCUMENTS

| 5,683,937 A | * | 11/1997 | Furukawa | ........... | H01S 5/04254 |
|---|---|---|---|---|---|
| | | | | | 438/42 |
| 7,675,954 B2 | * | 3/2010 | Kadowaki | ........... | H01S 5/04256 |
| | | | | | 372/43.01 |
| 8,279,906 B2 | * | 10/2012 | Kawanishi | ................ | H01S 5/16 |
| | | | | | 372/46.014 |

(Continued)

FOREIGN PATENT DOCUMENTS

JP 2008-041850 A 2/2008

*Primary Examiner* — Mark W Tornow
(74) *Attorney, Agent, or Firm* — Harrity & Harrity, LLP

(57) ABSTRACT

A semiconductor optical device includes an element structure layer that includes a mesa stripe extending in a first direction; an electrode film that covers at least an upper surface of the mesa stripe; an electrode pad portion that covers a part of a first region positioned in a second direction, intersecting the first direction, relative to the mesa stripe on an upper surface of the element structure layer and is electrically connected to the electrode film; a first dummy electrode that covers another part of the first region and is electrically insulated from the electrode film; and a second dummy electrode that covers at least a part of a second region positioned in a third direction, opposite to the second direction, relative to the mesa stripe on the upper surface of the element structure layer and is electrically insulated from the electrode film, wherein the first dummy electrode includes a first portion disposed in the first direction relative to the electrode pad portion and a second portion disposed in a fourth direction, opposite to the first direction, relative to the electrode pad portion.

20 Claims, 8 Drawing Sheets

(56) References Cited

U.S. PATENT DOCUMENTS

2007/0121695 A1* 5/2007 Miyamoto .......... H01S 5/04256
  372/50.124
2011/0198609 A1* 8/2011 Huang ................ H01L 33/382
  257/76

* cited by examiner

SEMICONDUCTOR OPTICAL DEVICE, OPTICAL MODULE, AND MANUFACTURING METHOD OF SEMICONDUCTOR OPTICAL DEVICE

CROSS-REFERENCE TO RELATED APPLICATION

The present application claims priority from Japanese application JP 2019-043177 filed on Mar. 8, 2019, which is hereby expressly incorporated by reference herein.

TECHNICAL FIELD

The present disclosure relates to a semiconductor optical device, an optical module, and a method of manufacturing a semiconductor optical device.

BACKGROUND

A semiconductor optical device may be mounted on a submount formed of, for example, a ceramic substrate. A wiring pattern, which is provided on the submount, and the semiconductor optical device may be electrically connected using a wire. Some systems may hold a semiconductor optical device by vacuum suction using a collet when the semiconductor optical device is mounted on the submount.

With the progress of miniaturization of a semiconductor optical device, a size of a semiconductor optical device is becoming smaller than the size of a suction port of a suction device, such as a collet. An electrode size of the semiconductor optical device is being reduced for high-speed response and high integration. When the semiconductor optical device is held by the suction device, the semiconductor optical device is adsorbed by the suction device sucking a flat region of the semiconductor optical device, the flat region becomes smaller due to miniaturization of the semiconductor optical device and suction failure by the suction device occurs. For that reason, it has become difficult to appropriately hold the semiconductor optical device by the suction device.

SUMMARY

According to some possible implementations, a semiconductor optical device may include an element structure layer that includes a mesa stripe extending in a first direction; an electrode film that covers at least an upper surface of the mesa stripe; an electrode pad portion that covers a part of a first region positioned in a second direction, intersecting the first direction, relative to the mesa stripe on an upper surface of the element structure layer and is electrically connected to the electrode film; a first dummy electrode that covers another part of the first region and is electrically insulated from the electrode film; and a second dummy electrode that covers at least a part of a second region positioned in a third direction, opposite to the second direction, relative to the mesa stripe on the upper surface of the element structure layer and is electrically insulated from the electrode film, wherein the first dummy electrode includes a first portion disposed in the first direction relative to the electrode pad portion and a second portion disposed in a fourth direction, opposite to the first direction, relative to the electrode pad portion.

According to some possible implementations, an optical module may include a semiconductor optical device that includes an element structure layer that includes a mesa stripe extending in a first direction; an electrode film that covers at least an upper surface of the mesa stripe; an electrode pad portion that covers a part of a first region positioned in a second direction, intersecting the first direction, relative to the mesa stripe on an upper surface of the element structure layer and is electrically connected to the electrode film; a first dummy electrode that covers another part of the first region and is electrically insulated from the electrode film; and a second dummy electrode that covers at least a part of a second region positioned in a third direction, opposite to the second direction, relative to the mesa stripe on the upper surface of the element structure layer and is electrically insulated from the electrode film, wherein the first dummy electrode includes a first portion disposed in the first direction relative to the electrode pad portion and a second portion disposed in a fourth direction, opposite to the first direction, relative to the electrode pad portion. The optical module may also include a submount on which a lower surface side of the semiconductor optical device is mounted, wherein wiring provided in the submount and the electrode pad portion are electrically connected by wire bonding.

According to some possible implementations, a method of manufacturing a semiconductor optical device may include preparing an element structure layer including a mesa stripe extending in a first direction; forming a conductive layer on an upper surface of the element structure layer; and separating the conductive layer to form: an electrode film that covers at least an upper surface of the mesa stripe, an electrode pad portion that covers a part of a first region positioned in a second direction, intersecting the first direction, relative to the mesa stripe on an upper surface of the element structure layer and is electrically connected to the electrode film, a first dummy electrode that covers another part of the first region and is electrically insulated from the electrode film, and a second dummy electrode that covers at least a part of a second region positioned in a third direction, opposite to the second direction, relative to the mesa stripe on the upper surface of the element structure layer and is electrically insulated from the electrode film, wherein, in the separating the conductive layer, the first dummy electrode includes a first portion disposed in the first direction relative to the electrode pad portion and a second portion disposed in a fourth direction, opposite to the first direction, relative to the electrode pad portion.

DETAILED DESCRIPTION

The following detailed description of example implementations refers to the accompanying drawings. The same reference numbers in different drawings may identify the same or similar elements.

Figure 1:
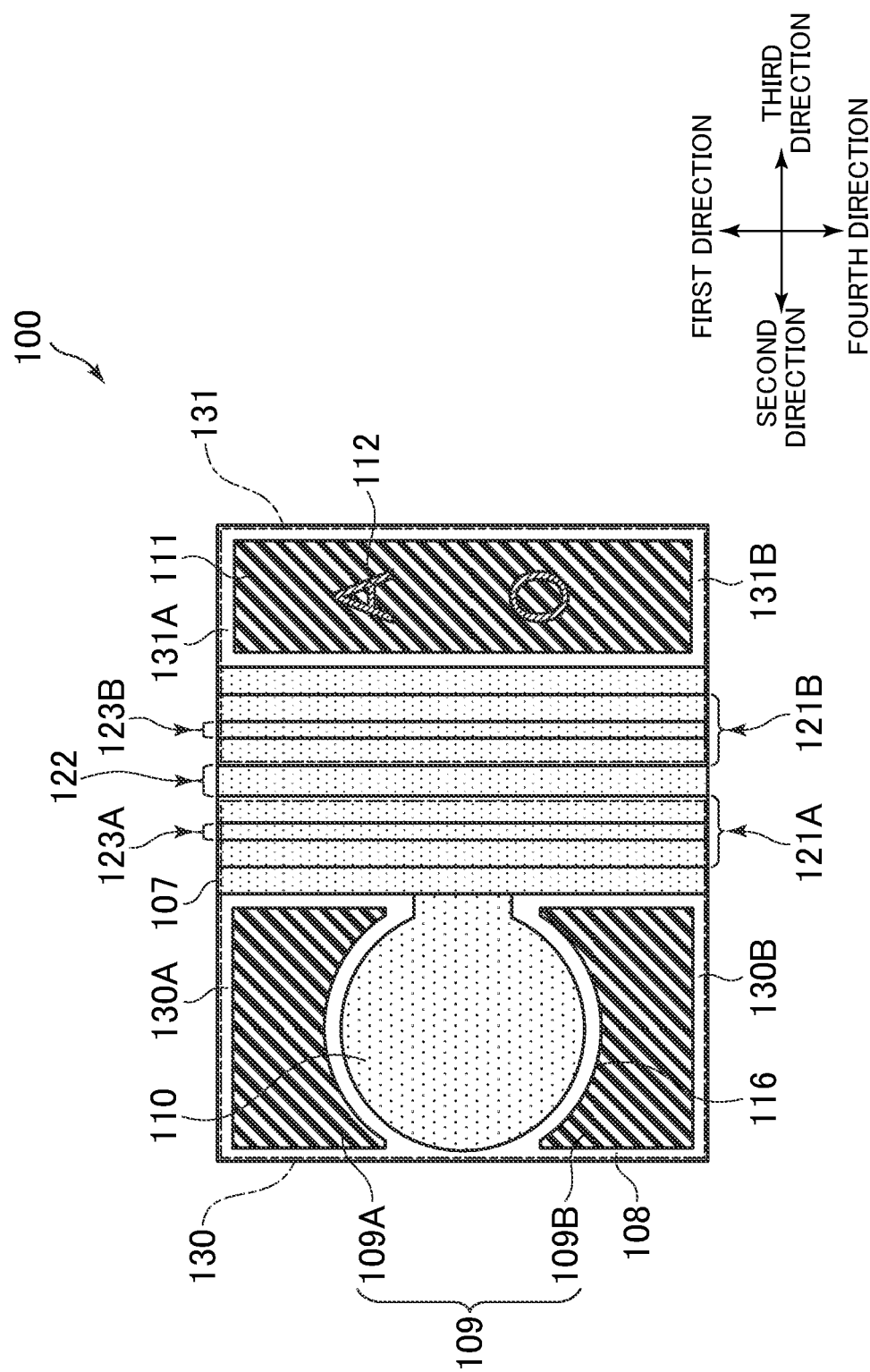
FIG. 1 is a schematic plan view of a semiconductor optical device according to a first example when viewed from above.
Figure 2:
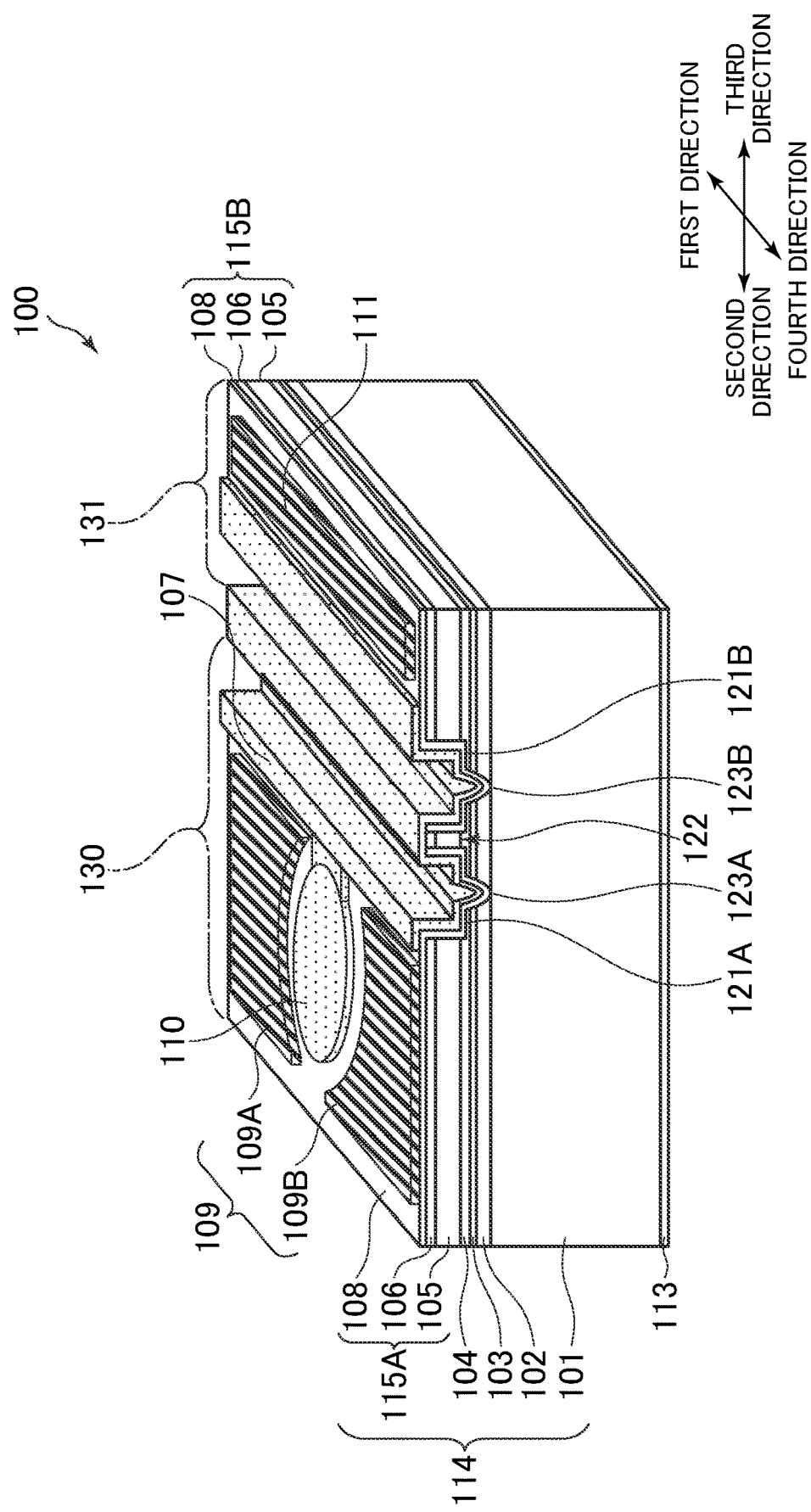
FIG. 2 is a schematic perspective view of the semiconductor optical device according to the first example.

FIG. 1 is a schematic plan view of a semiconductor optical device 100 when viewed from above. FIG. 2 is a schematic perspective view of the semiconductor optical device 100.

As illustrated in FIGS. 1 and 2, the semiconductor optical device 100 is, for example, a direct modulation type laser, and includes a semiconductor substrate 101, an n-InP layer 102, an active layer 103, a mesa etching stop layer 104, a p-type cladding layer 105, and a p-type contact layer 106 that are provided above the semiconductor substrate 101.

The semiconductor substrate 101, the n-InP layer 102, the active layer 103, the mesa etching stop layer 104, the p-type cladding layer 105, the p-type contact layer 106, and a passivation film 108 described later constitute an element structure layer 114.

The n-InP layer 102, the active layer 103, the mesa etching stop layer 104, the p-type cladding layer 105, and the p-type contact layer 106 can be sequentially formed on the upper surface of the semiconductor substrate 101 by, for example, metal organic chemical vapor deposition (MOCVD). As the semiconductor substrate 101, for example, an n-type InP substrate can be used.

The active layer 103 has, for example, a multiple quantum well (MQW) structure made of an InGaAlAs layer. The mesa etching stop layer 104 is made of, for example, a p-InGaAlAs layer, the p-type cladding layer 105 is made of, for example, a p-InP layer, and the p-type contact layer 106 is made of, for example, a p-InGaAs layer. A light confinement layer that suppresses oozing out of light of the active layer 103 may be provided on both or either of the upper layer and the lower layer of the MQW structure in the active layer 103. Although not illustrated, a diffraction grating may be disposed between the mesa etching stop layer 104 and the p-type cladding layer 105. An oscillation wavelength of the diffraction grating may be, for example, the 1.3 μm band.

As illustrated in FIGS. 1 and 2, semiconductor optical device 100 includes a first separation groove 121A and a second separation groove 121B that extend in a first direction along the upper surface of the element structure layer 114, on the upper surface side of the element structure layer 114. The first separation groove 121A and the second separation groove 121B can be formed by forming the p-type contact layer 106, and then, for example, forming a mask made of an insulating film such as $SiO_2$ using a photolithography process, and then performing etching processing from above. The mesa etching stop layer 104 may be formed at the bottom of the first separation groove 121A and the second separation groove 121B.

A region sandwiched between the first separation groove 121A and the second separation groove 121B constitutes a mesa stripe 122. As illustrated in FIG. 2, the mesa stripe 122 is a part of the element structure layer 114, and extends in the first direction, similarly to the first separation groove 121A and the second separation groove 121B.

Furthermore, the semiconductor optical device 100 is configured to have a first isolation groove 123A at the bottom of the first separation groove 121A and a second isolation groove 123B at the bottom of the second separation groove 121B. The first isolation groove 123A and the second isolation groove 123B can be formed by the photolithography process and etching processing described above. The first isolation groove 123A and the second isolation groove 123B penetrate the active layer 103 and extend to the n-InP layer 102 or the semiconductor substrate 101. The active layer 103 in the region sandwiched between the first isolation groove 123A and the second isolation groove 123B becomes a light-emitting portion.

The passivation film 108 is provided on the upper surfaces of the p-type contact layer 106, the first separation groove 121A, the second separation groove 121B, the first isolation groove 123A, and the second isolation groove 123B. The passivation film 108 is made of, for example, a $SiO_2$ film. The passivation film 108 is configured so as not to be provided on the upper surface of the mesa stripe 122. As a method of forming such the passivation film 108, for example, the passivation film 108 can be formed by forming a $SiO_2$ film on the entire exposed upper surfaces of the p-type contact layer 106, the first separation groove 121A, the second separation groove 121B, the first isolation groove 123A, the second isolation groove 123B, and the mesa stripe 122, and then removing the $SiO_2$ film on the upper surface of the mesa stripe 122.

Semiconductor optical device 100 may include an electrode film 107 that covers the upper surface of the mesa stripe 122. As described above, since the passivation film 108 is configured so as not to be provided on the upper surface of the mesa stripe 122, the upper surface of the mesa stripe 122 and the electrode film 107 are electrically connected. The electrode film 107 is formed so as to straddle the first separation groove 121A and the second separation groove 121B.

On the upper surface of the element structure layer 114, a region positioned in the second direction, intersecting the first direction, relative to the mesa stripe 122 is set as a first region 130, and a region positioned in the third direction, which is opposite to the second direction, relative to the mesa stripe 122, is set as a second region 131.

The p-type cladding layer 105, the p-type contact layer 106, and the passivation film 108 disposed in the second direction intersecting the first direction with respect to the first separation groove 121A constitute a first bump portion 115A. The p-type cladding layer 105, the p-type contact layer 106, and the passivation film 108 disposed in the third direction opposite to the second direction with respect to the second separation groove 121B constitute a second bump portion 115B. That is, the element structure layer 114 includes the first bump portion 115A in the first region 130 and the second bump portion 115B in the second region 131.

As described above, since the passivation film 108 is not provided on the upper surface of the mesa stripe 122, a configuration in which the height of the upper surfaces of the first bump portion 115A and the second bump portion 115B is higher than the height of the upper surface of the mesa stripe 122 by the thickness of the passivation film 108 is adopted.

As illustrated in FIGS. 1 and 2, an electrode pad portion 110 electrically connected to the electrode film 107 and a first dummy electrode 109 electrically insulated from the electrode film 107 are disposed in the first region 130. The electrode pad portion 110 covers a part of the first region 130 and the first dummy electrode 109 covers another part of the first region 130. A second dummy electrode 111 electrically insulated from the electrode film 107 is disposed in the second region 131. The second dummy electrode 111 covers at least a part of the second region 131. The electrode pad portion 110 is electrically connected to a wiring formed on the submount of the optical module described later by wire bonding. The electrode pad portion 110 is electrically and physically connected to the electrode film 107.

By adopting such a configuration, it is possible to realize the semiconductor optical device 100 capable of suppressing suction failure by a suction device such as a collet. When the upper surface of the semiconductor optical device 100 is uneven, there is a risk that suction failure occurs because the element is tilted and contacts a suction surface of the suction device, or suction failure due to air leakage from a recess occurs. When the upper surface of the semiconductor optical device 100 is sufficiently large with respect to the suction device, although this problem can be solved by sucking a flat portion on a part of the upper surface of the semiconductor optical device 100, as the semiconductor optical device 100 is reduced in size, it is also difficult to solve the problem by making the upper surface of the semiconductor optical device large. With respect to this problem, by adopting the configuration of the present disclosure, the semiconductor optical device 100 is configured to include the first dummy electrode 109 disposed in the first region 130 and the second dummy electrode 111 disposed in the second region 131 on the upper surface of the element structure layer 114, thereby capable of increasing an area of a flat region on the upper surface of the semiconductor optical device 100. As a result, it is possible to suppress occurrence of suction failure by the suction device.

By adopting a configuration in which the first dummy electrode 109 is provided in the first region 130 and the second dummy electrode 111 is provided in the second region 131 instead of providing the dummy electrode only in the first region 130 or the second region 131, an increase in the amount of suction of only one of the first region 130 and the second region 131 can be suppressed and tilting of the semiconductor optical device 100 during suction can be suppressed.

Furthermore, by adopting a configuration in which the first dummy electrode 109 and the second dummy electrode 111 that are electrically insulated from the electrode film 107 are provided instead of a conductor electrically connected to the electrode film 107, it is possible to provide the semiconductor optical device 100 excellent in high-speed response without causing an increase in parasitic capacitance. That is, it is possible to realize the semiconductor optical device 100 that is excellent in high-speed response and that can suppress occurrence of suction failure by the suction device.

In order to secure an area of a flat surface, although a configuration in which the electrode pad portion 110 is formed larger than necessary in the first region 130 is also conceivable, by configuring the first dummy electrode 109 in the first region 130, it is possible to avoid making the electrode pad portion 110 unnecessarily large and suppress generation of parasitic capacitance.

The element structure layer 114 may have a rectangular outer shape when viewed from above the element structure layer 114. In the configuration in which the element structure layer 114 has the rectangular outer shape as described above, as illustrated in FIGS. 1 to 5, at least a part of the first dummy electrode 109 and the second dummy electrode 111 may be disposed along the four corners of the rectangular shape.

Figure 6:
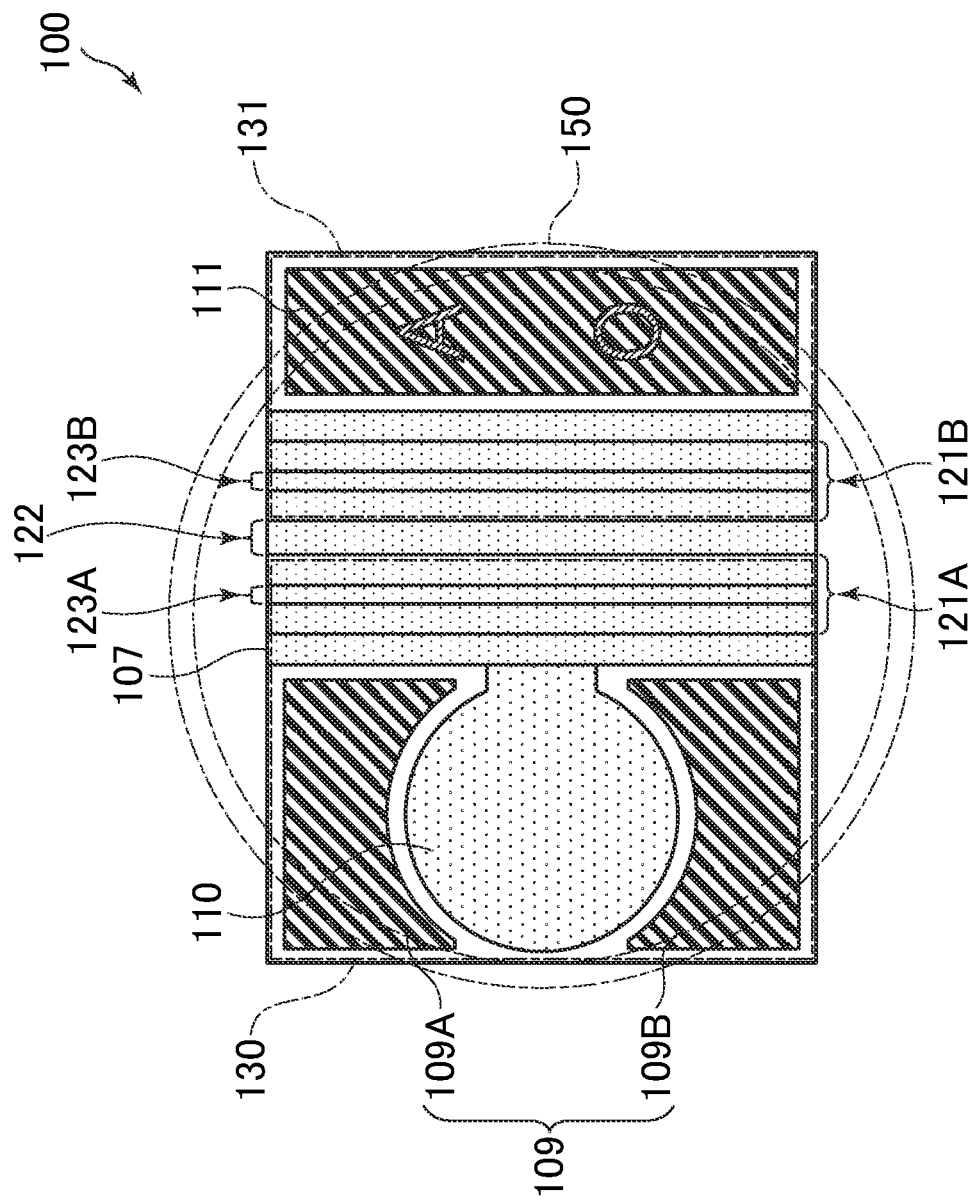
FIG. 6 is a schematic plan view illustrating a disposition relationship between the semiconductor optical device and a suction port of a suction device according to the first example.

By adopting such a configuration, for example, as illustrated in FIG. 6, even when the outer shape of the semiconductor optical device 100 is relatively small, a part of the first dummy electrode 109 and the second dummy electrode 111 disposed along the four corners of the rectangular shape can be configured to be disposed outside the outer periphery of a suction port 150, and it becomes possible to suppress suction failure.

First dummy electrode 109 and the second dummy electrode 111 may be disposed so as to extend along 80% or more of the sides constituting the outer shape of the element structure layer 114. By adopting such a configuration, it is possible to suppress air leakage from between the first dummy electrode 109 and the electrode film 107, between the second dummy electrode 111 and the electrode film 107, and the like, and it becomes possible to suppress suction failure.

As a method of forming the electrode film 107, the electrode pad portion 110, the first dummy electrode 109, and the second dummy electrode 111, for example, the following method can be used.

First, a conductive layer having a three-layer structure of titanium, platinum, and gold is deposited on the entire exposed upper surfaces of the passivation film 108 and the mesa stripe 122 using, for example, a vapor deposition method. In this three-layer structure, gold is the top layer and titanium is the bottom layer.

Here, as illustrated in FIG. 1, for example, in a case where a symbol 112 is attached to a position visually recognized from above the second dummy electrode 111, a mask is formed in a portion other than a region where the symbol 112 is formed to protect the portion and the platinum layer is exposed by removing the gold layer in the three-layer structure described above by etching or the like in the region where the symbol 112 is formed. With such a method, for example, the symbol 112 that means an identification number of the semiconductor optical device 100 can be attached to the upper surface of the second dummy electrode 111.

Next, a portion other than between the first dummy electrode 109 and the electrode pad portion 110 illustrated in FIG. 1, between the first dummy electrode 109 and the electrode film 107, and between the second dummy electrode 111 and the electrode film 107 is masked with a resist or the like. Then, each electrode is patterned by removing the conductive layer in a region not masked by milling or the like. Milling is a method of removing a predetermined region by irradiating a predetermined region with high energy such as an ion beam. With such a method, the first dummy electrode 109 and the electrode pad portion 110, the first dummy electrode 109 and the electrode film 107, and the second dummy electrode 111 and the electrode film 107 can be electrically and physically separated. The symbol 112 described above may be formed in this process. Milling is performed without masking a portion between the region to be the symbol 112 and each electrode described above. In the case of this method, the symbol 112 is formed in a form in which a part of the three conductive layers of the second dummy electrode 111 is removed.

In order to obtain such a manufacturing method, the first dummy electrode 109 is configured to have an edge 116 along at least a part of the outer periphery of the electrode pad portion 110. For example, as illustrated in FIGS. 1 and 2, if the outer periphery of the electrode pad portion 110 is circumferential, the first dummy electrode 109 is configured to have the arc-shaped edge 116 along the outer periphery of the electrode pad portion 110. If the outer periphery of the electrode pad portion 110 is polygonal, the electrode pad portion 110 is configured to have a bent edge along the outer periphery of the polygonal shape. In the configuration illustrated in FIGS. 1 and 2, the outer periphery of the electrode pad portion 110 has a circumferential shape, and the curvature of the arc-shaped edge 116 of the first dummy electrode 109 is larger than the curvature of the outer periphery of the electrode pad portion 110. At least a part of the outer periphery of the electrode pad portion 110 and the arc-shaped edge 116 of the first dummy electrode 109 are disposed so as to face each other and are disposed with a gap having a certain width. By adopting such a configuration, the electrode pad portion 110 and the first dummy electrode 109 can be disposed close to each other. For that reason, in a limited area of the upper surface of the semiconductor optical device 100, the area of the first dummy electrode 109, that is, the area of the flat surface can be increased, and the occurrence of suction failure by the suction device can be suppressed. Furthermore, since the amount of air flowing between the electrode pad portion 110 and the first dummy electrode 109 can be reduced, it is possible to suppress the occurrence of suction failure by the suction device.

According to the manufacturing method described above, film thicknesses of the first dummy electrode 109, the second dummy electrode 111, the electrode pad portion 110, and the electrode film 107 can be made equal. As described above, the configuration in which the heights of the upper surfaces of the first bump portion 115A where the first dummy electrode 109 and the electrode pad portion 110 are disposed and the second bump portion 115B where the second dummy electrode 111 is disposed are higher than the height of the upper surface of the mesa stripe 122 by the thickness of the passivation film 108 is adopted. For that reason, when viewed from above the element structure layer 114, the upper surface of the first dummy electrode 109 and the upper surface of the second dummy electrode 111 higher than the height of the upper surface of the electrode film 107 in the region overlapping the mesa stripe 122 are disposed at a position higher by the thickness of the passivation film 108.

Figure 7:
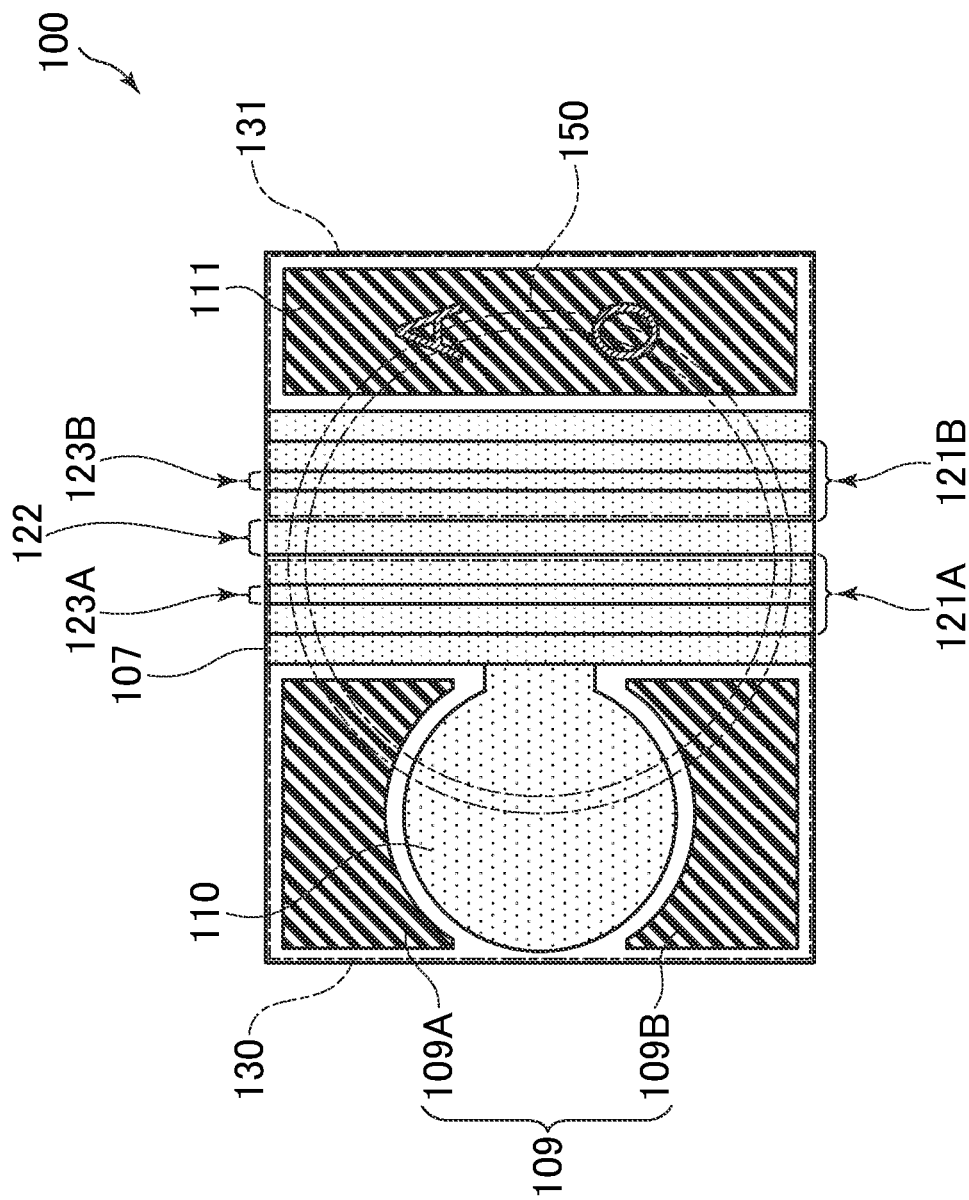
FIG. 7 is a schematic plan view illustrating a disposition relationship between the semiconductor optical device and the suction port of the suction device according to the first example.

As a result, as illustrated in FIG. 7, even when the suction port 150 of a suction device such as a collet is disposed so as to intersect the mesa stripe 122 when viewed from above the element structure layer 114, the suction port 150 of the suction device such as a collet can bring the outer periphery of the suction port 150 into contact with the upper surfaces of the first dummy electrode 109 and the second dummy electrode 111 without obstructing the presence of the mesa stripe 122, and the occurrence of suction failure can be suppressed.

When viewed from above the element structure layer 114, a layer structure of the element structure layer 114 in a region overlapping the first dummy electrode 109 and the layer structure of the element structure layer 114 in a region overlapping the second dummy electrode 111 have the same configuration. For that reason, the heights of the upper surface of the first dummy electrode 109 and the upper surface of the second dummy electrode are substantially equal.

From accuracy of photolithography and etching processing, the distance between the side surface of the first dummy electrode 109 and the side surface of the electrode pad portion 110, the distance between the side surface of the first dummy electrode 109 and the side surface of the electrode film 107, and the distance between the side surface of the second dummy electrode 111 and the side surface of the electrode film 107 may be 5 μm or more. When the distance between the side surface of the first dummy electrode 109 and the side surface of the electrode pad portion 110, the distance between the side surface of the first dummy electrode 109 and the side surface of the electrode film 107, and the distance between the side surface of the second dummy electrode 111 and the side surface of the electrode film 107 are 10 μm or less, the area of the first dummy electrode 109 and the second dummy electrode 111 may be ensured, the area of the flat surface may be increased, and an occurrence of suction failure by the suction device may be suppressed.

According to the manufacturing method described above, since the electrode film 107, the electrode pad portion 110, the first dummy electrode 109, and the second dummy electrode 111 can be formed by a common process, manufacturing efficiency is high and desirable.

As illustrated in FIGS. 1 and 2, the configuration in which the first dummy electrode 109 includes a first portion 109A disposed in the first direction relative to the electrode pad portion 110 and a second portion 109B disposed in the fourth direction, opposite to the first direction, relative to the electrode pad portion 110, and the first portion 109A and the second portion 109B are disposed separately from each other is adopted.

As such, by adopting the configuration in which the first dummy electrode 109 includes the first portion 109A disposed in the first direction relative to the electrode pad portion 110 and the second portion 109B disposed in the fourth direction, opposite to the first direction, relative to the electrode pad portion 110, the flat region can be formed at end portions in the first direction and the fourth direction on the upper surface of the semiconductor optical device 100, and thus it is possible to suppress the occurrence of suction failure by the suction device.

Figure 3:
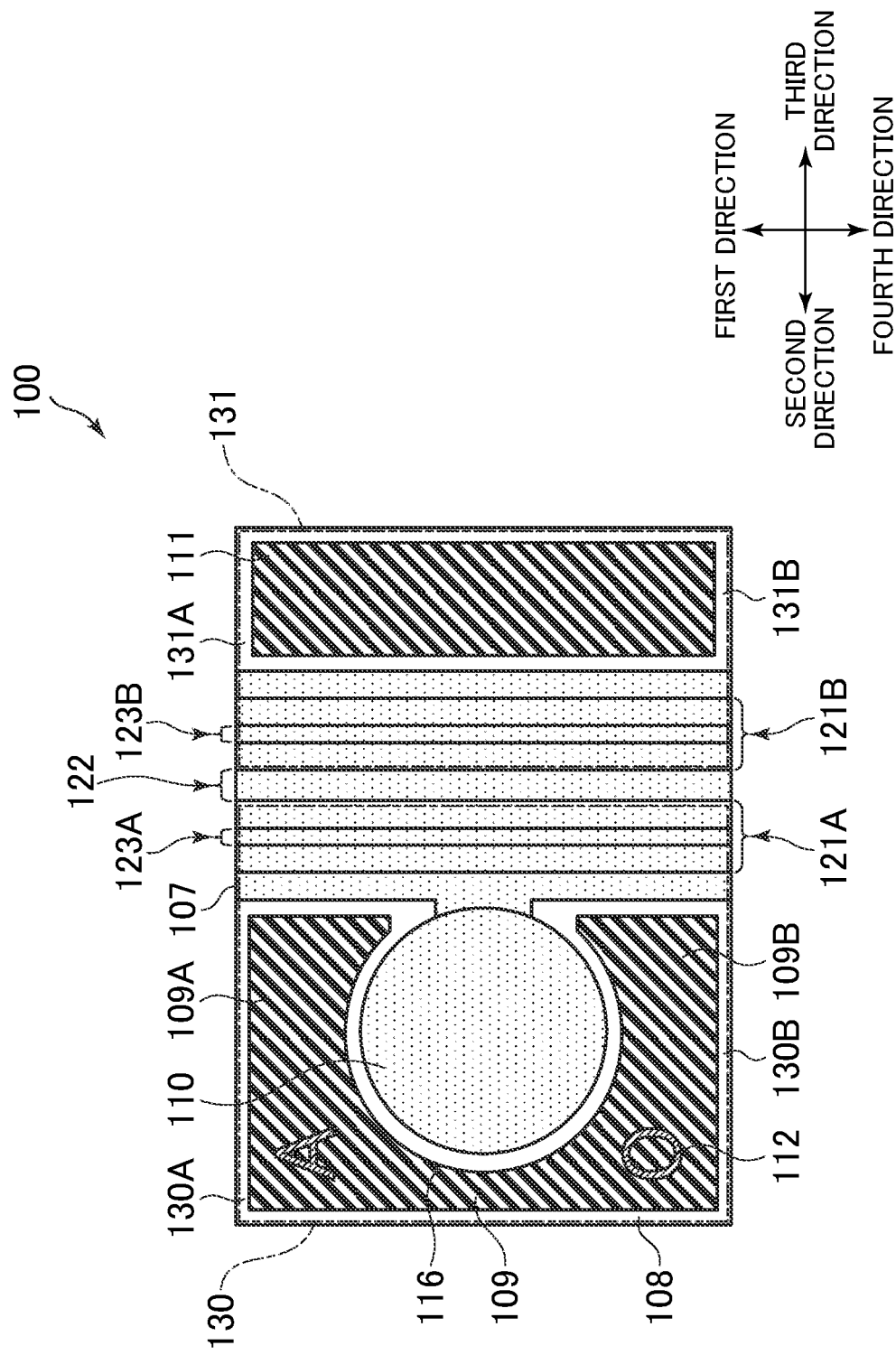
FIG. 3 is a schematic plan view of a semiconductor optical device according to another example of the first example when viewed from above.
Figure 4:
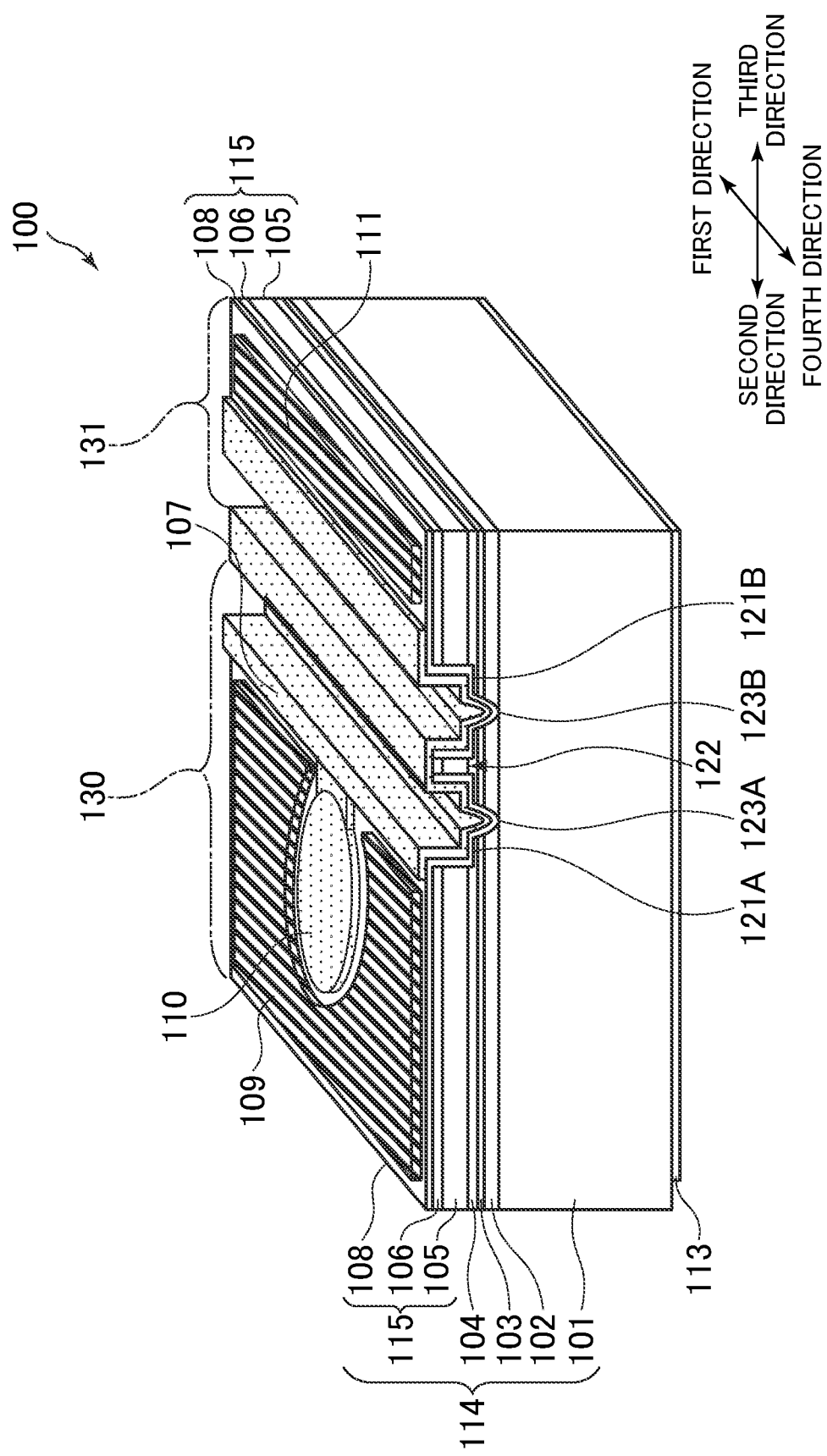
FIG. 4 is a schematic perspective view of a semiconductor optical device according to another example of the first example.

As illustrated in FIGS. 3 and 4, the first dummy electrode 109 may be configured to surround the electrode pad portion 110 from the first direction, the second direction, and the fourth direction. In the configuration illustrated in FIGS. 3 and 4, a configuration in which the first portion 109A disposed in the first direction relative to the electrode pad portion 110 and the second part 109B disposed in the fourth direction, opposite to the first direction, relative to the electrode pad portion 110 are integrated is adopted. The configuration illustrated in FIGS. 3 and 4 can be configured to block an air escape path as compared with the semiconductor optical device 100 illustrated in FIGS. 1 and 2, and thus it becomes possible to further suppress suction failure by the suction device. That is, in the configuration illustrated in FIGS. 1 and 2, the first portion 109A and the second portion 109B are disposed separately, and thus there is a possibility that air flows between the first and second portions. However, in the configuration illustrated in FIGS. 3 and 4, such an air escape path can be blocked, and thus it is possible to further suppress the suction failure caused by the suction device.

On the other hand, the configuration illustrated in FIGS. 1 and 2 is desirable from the viewpoint of miniaturization as compared with the configuration illustrated in FIGS. 3 and 4. That is, in the configuration of FIGS. 1 and 2, it is possible to reduce the size as compared with the configuration illustrated in FIGS. 3 and 4 by a portion where the first dummy electrode 109 is not disposed on the electrode pad portion 110 in the second direction.

In order to adjust the suction amount in the first region 130 and the second region 131, as illustrated in FIGS. 1 and 2, a configuration in which the first portion 109A and the second portion 109B are separated and the distance between the first and second portions is adjusted may be adopted. For example, in the case of the configuration in which the second region 131 is more likely to be subjected to suction failure compared to the first region 130, when suction is performed by the suction device, there is a risk that the semiconductor optical device 100 is tilted and dropped. However, the suction amount of the first region 130 and the second region 131 can be adjusted and balanced by intentionally separating the first portion 109A and the second portion 109B.

Figure 5:
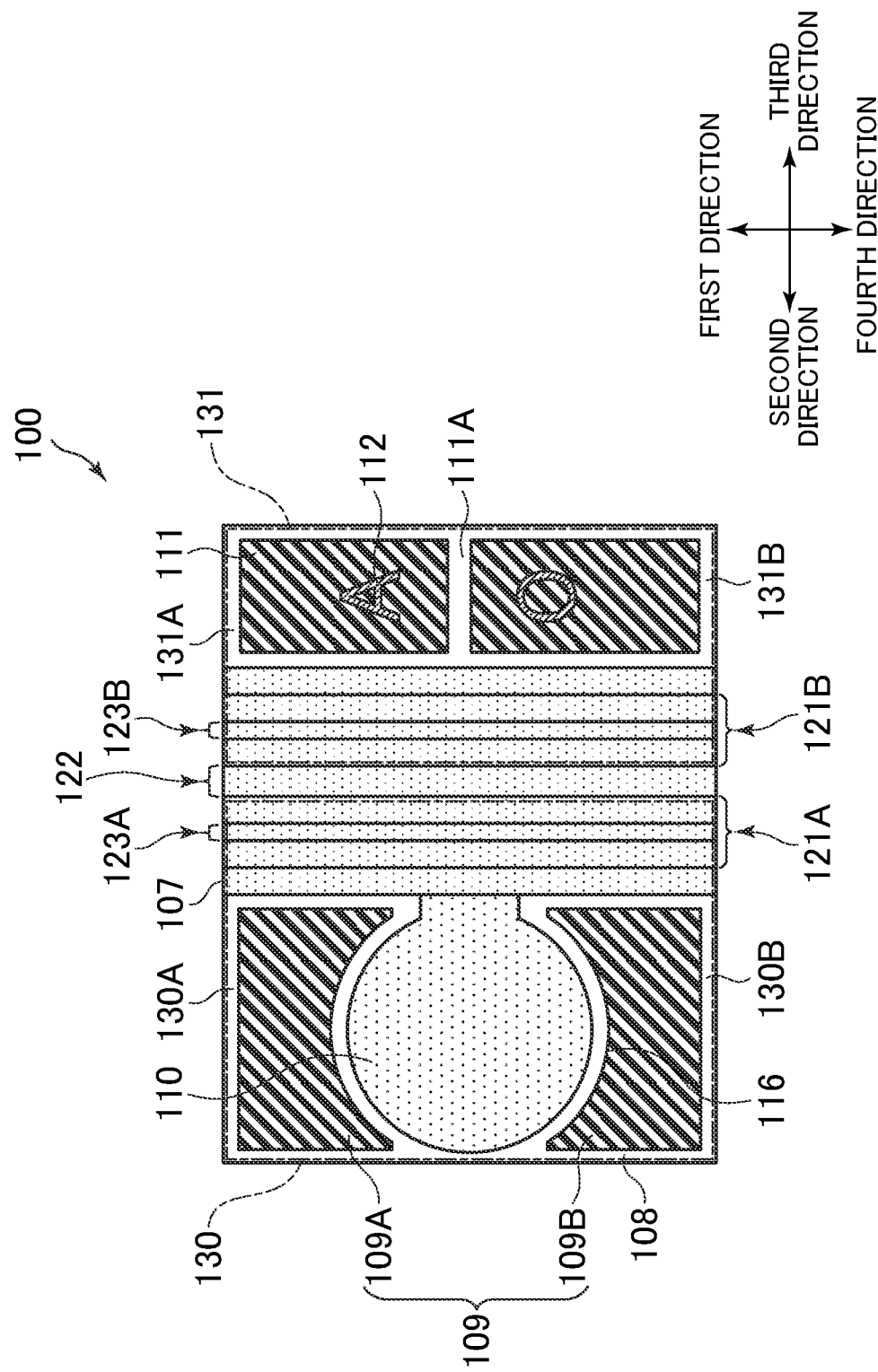
FIG. 5 is a schematic plan view of a semiconductor optical device according to another example of the first example when viewed from above.

As illustrated in FIG. 5, a configuration in which a slit 111A is formed in the second dummy electrode 111 and the suction amount of the second region 131 is intentionally reduced to balance the suction amount of the first region 130 and the second region 131 may be adopted. For example, the slit 111A may be provided in a direction intersecting the first direction which is the extending direction of the mesa stripe 122.

In the example illustrated in FIGS. 1 to 5, the second dummy electrode 111 is disposed in parallel with the electrode film 107 in the second region 131. When viewed from above the element structure layer 114, an area not covered with the second dummy electrode 111 and the electrode film 107 in the second region 131 is 20% or less of the area of the second region 131.

In the example illustrated in FIGS. 1 and 2, since the second dummy electrode 111 has a relatively large area in the second region 131, a configuration in which the symbol 112 is attached to the upper surface of the second dummy electrode 111 by the method described above is adopted.

As such, when viewed from above the element structure layer 114, by making the area not covered with the second dummy electrode 111 and the electrode film 107 in the second region 131 20% or less of the area of the second region 131, the area of the flat region in the second region 131 can be increased, and thus it is possible to suppress the occurrence of suction failure by the suction device.

In particular, in the example illustrated in FIGS. 1 to 5, the mesa stripe 122 is configured to be shifted in the third direction when viewed from above the element structure layer 114. In such a configuration, there is a problem that the area of the second region 131 positioned in the third direction relative to the electrode film 107 becomes small, and the area of the flat region in the second region 131 becomes small. In order to address this problem, as described above, when viewed from above the element structure layer 114, by making the area not covered with the second dummy electrode 111 and the electrode film 107 in the second region 131 20% or less of the area of the second region 131, the effect of suppressing suction failure by the suction device becomes more remarkable.

Similarly, an occurrence of suction failure by the suction device may be suppressed by making the area not covered with the first dummy electrode 109, the electrode pad portion 110, and the electrode film 107 in the first region 130 20% or less of the area of the first region and increasing the area of the flat region in the first region 130, when viewed from above the element structure layer 114.

In the configuration illustrated in FIGS. 1 and 2, although the configuration in which the symbol 112 is attached to the upper surface of the second dummy electrode 111 is illustrated, as illustrated in FIGS. 3 and 4, when the first dummy electrode 109 has a larger area than the second dummy electrode 111, a configuration in which the symbol 112 is attached to the upper surface of the first dummy electrode 109 may be adopted. As a method of forming the symbol 112, the same method as the method of forming the symbol 112 on the upper surface of the second dummy electrode 111 may be used.

As illustrated in FIGS. 1 to 5, an n-type electrode 113 is provided on the lower surface of the semiconductor substrate 101. The n-type electrode 113 can be formed, for example, by performing patterning on the lower surface of the semiconductor substrate 101 by a vapor deposition method and photolithography technique.

When viewed from above the element structure layer 114, the first region 130 may include a first end side region 130A that intersects the first direction, in which the first dummy electrode 109 is not disposed, and the second region 131 may include a second end side region 131A that intersects the first direction, in which the second dummy electrode 111 is not disposed. When viewed from above the element structure layer 114, the first region 130 may include a third end side region 130B that intersects the fourth direction, in which the first dummy electrode 109 is not disposed, and the second region 131 may include a fourth end side region 131B that intersects the fourth direction, in which the second dummy electrode 111 is not disposed is adopted. The reason will be described below.

A plurality of semiconductor optical devices 100 are formed on a wafer and then individually formed after being subjected to individualization. An individualization process can be broadly divided into two stages. The first stage is a bar forming process for dividing the plurality of semiconductor optical devices 100 into a bar state in which the plurality of semiconductor optical devices 100 are connected in a direction intersecting the extending direction (first direction) of the mesa stripe 122. The second stage is a chip forming process for individualizing the plurality of semiconductor optical devices 100 from the bar state by cleaving the plurality of semiconductor optical devices in a direction parallel to the extending direction of the mesa stripe 122. Specifically, in the bar forming process for dividing the semiconductor optical device into the bar state, the element structure layer 114 subjected to the manufacturing method described above is scribed from above (or below) with a laser, and then a blade is pressed against the element structure layer 114 from below (or above), thereby forming a semiconductor optical device group (bars) connected in a direction intersecting the extending direction (first direction) of the mesa stripe 122. Here, a cut surface of the semiconductor optical device group is a cleavage surface, which is an emission surface from which laser light is emitted. In addition, a laser may perform scribing from above the element structure layer 114. By adopting such a method, in the process of pressing the blade against the semiconductor optical device, it may not be necessary to press the blade against the semiconductor optical device from the surface side where the mesa stripe 122 is disposed and quality deterioration of the mesa stripe 122 can be suppressed. Since a position of laser scribing can be controlled with higher precision than a cutting position at which the blade is pressed against the semiconductor optical device, quality deterioration of the mesa stripe 122 can be suppressed.

Next, for example, a reflection film having reflectance of 1% or less is formed on the front emission surface of laser light, and a reflection film having a reflectance of 90% or more is formed on the rear emission surface.

Thereafter, the plurality of semiconductor optical devices 100 are manufactured by scribing and cutting the semiconductor optical device group with a diamond cutter in the extending direction (first direction) of the mesa stripe 122 (chip forming process). In this case, a configuration in which the width of the semiconductor optical device 100 in the direction orthogonal to the first direction is 200 µm or less may be adopted. That is, as described above, in the case of the semiconductor optical device 100, even if a small configuration in which the width of the semiconductor optical device in the direction orthogonal to the first direction is 200 µm or less is adopted, the area of the flat region on the upper surface of the semiconductor optical device 100 is increased by providing the first dummy electrode 109 and the second dummy electrode 111, and thus it is possible to suppress the occurrence of suction failure by the suction device.

In the process of forming the semiconductor optical device group (bar) described above, although scribing may be performed with the laser, in this case, the first dummy electrode 109 and the second dummy electrode 111 may not be disposed up to the first end side region 130A of the first region 130 and the second end side region 131A of the second region 131. By adopting such a configuration, it may be possible to suppress bending of the first dummy electrode 109 and the second dummy electrode 111 during the scribing, and it is possible to suppress cracking of the first dummy electrode 109 and the second dummy electrode 111. Furthermore, it is possible to suppress conduction between any of the layers disposed below the passivation film 108 and the first dummy electrode 109 and the second dummy electrode 111 with the occurrence of bending in the first dummy electrode 109 and the second dummy electrode 111. For that reason, when viewed from above the element structure layer 114, the first region 130 may include the first end side region 130A that intersects the first direction, in which the first dummy electrode 109 is not disposed, and the second region 131 may include the second end side region 131A that intersects the first direction, in which the second dummy electrode 111 is not disposed. Similarly, when viewed from above the element structure layer 114, the first region 130 may include the third end side region 130B that intersects the fourth direction, in which the first dummy electrode 109 is not disposed, and the second region 131 may include the fourth end side region 131B that intersects the fourth direction, in which the second dummy electrode 111 is not disposed.

However, from the viewpoint of suppressing suction failure by the suction device, the first dummy electrode 109 may be disposed up to the first end side region 130A of the first region 130 and the second dummy electrode 111 may be disposed up to the second end side region 131A of the second region 131. Similarly, the first dummy electrode 109 may be disposed up to the third end side region 130B of the first region 130 and the second dummy electrode 111 may be disposed up to the fourth end side region 131B of the second region 131.

The mesa stripe 122 is desirably formed up to the end side region intersecting the first direction and the fourth direction when viewed from above the element structure layer 114. By adopting such a structure, all regions of the active layer 103 can contribute to light emission, and it is possible to suppress that the active layer 103 functions as a light absorption layer. For that reason, quality deterioration of the semiconductor optical device 100 can be suppressed.

As illustrated in FIGS. 1 to 5, when the semiconductor optical device group is scribed with a diamond cutter in the extending direction (first direction) of the mesa stripe 122 and cut, the mesa stripe 122 is cut so as to be configured to be shifted in the third direction when viewed from above the element structure layer 114. By adopting such a configuration, it is possible to reduce the size of the entire semiconductor optical device 100 while securing the area of the first region 130 in which the electrode pad portion 110 is disposed. Since the electrode pad portion 110 is not provided in the second region 131, the second region 131 may have a minimum area so that the second isolation groove 123B is not cut in the individualization process described above. For that reason, in the examples illustrated in FIGS. 1 to 5, the configuration in which the area of the second region 131 is smaller than the area of the first region 130 is adopted.

Figure 8:
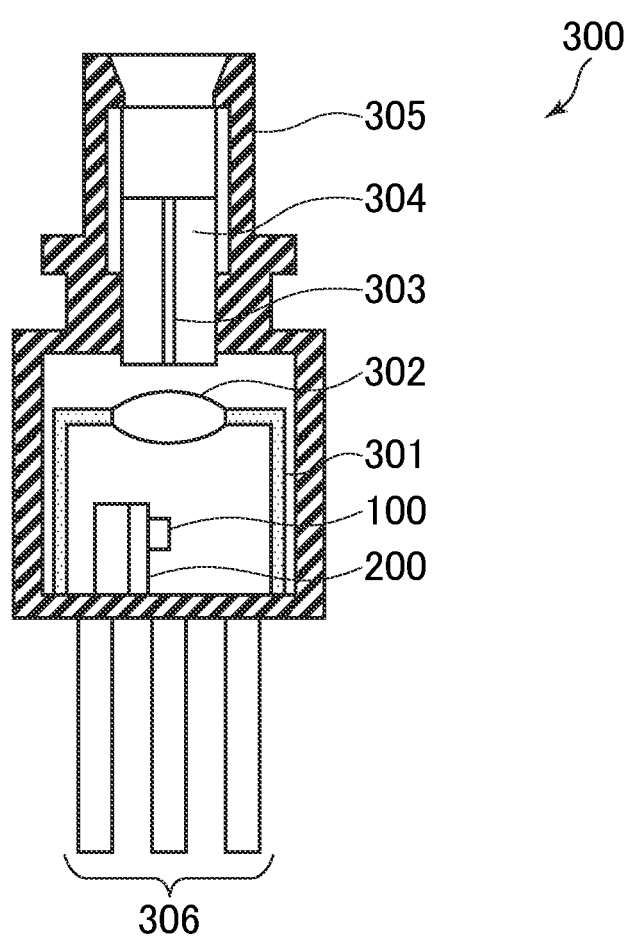
FIG. 8 is a schematic view illustrating an example in which the semiconductor optical device according to the first example is mounted on an optical module.

FIG. 8 is a schematic view illustrating an example in which the semiconductor optical device 100 described above is mounted on an optical module 300. The optical module 300 may include an entire accommodating portion 305, a lens 302 that allows light output from the semiconductor optical device 100 to enter an optical fiber 303, and a submount 200 that inputs an electrical signal to the semiconductor optical device 100, and a lead pin 306.

The entire accommodating portion 305 is a metallic member for accommodating each member of the optical module 300, and is configured to include an optical fiber accommodating portion 304 and a lens accommodating portion 301. The optical fiber accommodating portion 304 is a metallic cylindrical member for storing the optical fiber 303. The optical fiber 303 having a connector is inserted into the optical fiber accommodating portion 304 from the outside. The lens 302 is fitted in a hole formed at a predetermined position in the lens accommodating portion 301, and the lens accommodating portion 301 supports the lens 302.

Although not particularly illustrated, the submount 200 made of aluminum nitride or the like on which a high-frequency signal line is printed is mounted on the bottom surface (surface to which the lead pin 306 is connected) of the entire accommodating portion 305. On the submount 200, the semiconductor optical device 100 described above is mounted. The semiconductor optical device 100 is held by the suction device such as a collet and disposed on the submount 200. As described above, the semiconductor optical device 100 is configured to be able to suppress the occurrence of suction failure by the suction device by including the first dummy electrode 109 and the second dummy electrode 111. For that reason, the semiconductor optical device 100 can be disposed at an appropriate location on the submount 200 using the suction device such as a collet.

The lower surface of the semiconductor optical device 100 is mounted on the submount 200, and the upper surface of the semiconductor optical device 100 provided with the electrode pad portion 110 is exposed. Then, the semiconductor optical device 100 can be energized by electrically connecting the wiring provided in the submount and the electrode pad portion 110 by wire bonding.

The submount 200 and the semiconductor optical device 100 are electrically connected to a flexible substrate (not illustrated) existing outside the optical module 300 via the lead pin 306. The lead pin 306 is connected from the outside of the bottom surface of the entire accommodating portion 305. The electrical signal input to the semiconductor optical device 100 is transmitted from the flexible substrate via the lead pin 306.

Although the ridge type semiconductor optical device 100 is described as an example, the same effect can be obtained also in a semiconductor optical device having an embedded semiconductor layer or an embedded resin layer. Although the semiconductor optical device 100 is described as an example of the direct modulation type laser, the semiconductor optical device 100 may be an electro-absorption modulator. Although the direct modulation laser may have a configuration in which the area of upper surface is generally small, it is possible to suppress suction failure by the suction device by adopting the configuration of the present disclosure described above.

The foregoing disclosure provides illustration and description, but is not intended to be exhaustive or to limit the implementations to the precise forms disclosed. Modifications and variations may be made in light of the above disclosure or may be acquired from practice of the implementations.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor optical device comprising:
   an element structure layer that includes a mesa stripe extending in a first direction;
   an electrode film that covers at least an upper surface of the mesa stripe;
   an electrode pad portion that covers a part of a first region positioned in a second direction, intersecting the first direction, relative to the mesa stripe on an upper surface of the element structure layer and is electrically connected to the electrode film;
   a first dummy electrode that covers another part of the first region and is electrically insulated from the electrode film; and
   a second dummy electrode that covers at least a part of a second region positioned in a third direction, opposite to the second direction, relative to the mesa stripe on the upper surface of the element structure layer and is electrically insulated from the electrode film,
   wherein the first dummy electrode includes a first portion disposed in the first direction relative to the electrode pad portion and a second portion disposed in a fourth direction, opposite to the first direction, relative to the electrode pad portion, and
   wherein a gap between the first dummy electrode and the electrode pad portion has a depth that ends at an uppermost surface of the upper surface of the element structure layer.

2. The semiconductor optical device of claim 1, wherein the first dummy electrode has an edge along at least a part of an outer periphery of the electrode pad portion.

3. The semiconductor optical device of claim 2, wherein the outer periphery of the electrode pad portion is circumferential, and
   the edge of the first dummy electrode has an arc shape having a curvature larger than a curvature of the outer periphery.

4. The semiconductor optical device of claim 3, wherein at least a part of the outer periphery and the edge are disposed to face each other and are separated by the gap.

5. The semiconductor optical device of claim 4, wherein the gap is 5 μm or more and 10 μm or less.

6. The semiconductor optical device of claim 1, wherein the element structure layer includes a first bump portion in the first region and a second bump portion in the second region.

7. The semiconductor optical device of claim 1, wherein, when viewed from above the element structure layer, an upper surface of the first dummy electrode and an upper surface of the second dummy electrode are disposed at a position higher than a height of the upper surface of the electrode film in a region overlapping the mesa stripe.

8. The semiconductor optical device of claim 1, wherein the first portion and the second portion are physically separated from each other.

9. The semiconductor optical device of claim 1, wherein the first dummy electrode surrounds the electrode pad portion in the first direction, the second direction, and the fourth direction.

10. The semiconductor optical device of claim 1, wherein an area of the second region is smaller than the area of the first region.

11. The semiconductor optical device of claim 1, wherein, when viewed from above the element structure layer, an area not covered with the second dummy electrode and the electrode film in the second region is 20% or less of the area of the second region.

12. The semiconductor optical device of claim 11, wherein a symbol is attached to a position visually recognized from above at least one of the first dummy electrode or the second dummy electrode.

13. The semiconductor optical device of claim 1, wherein, when viewed from above the element structure layer, an area not covered with the first dummy electrode, the electrode pad portion, and the electrode film in the first region is 20% or less of the area of the first region.

14. The semiconductor optical device of claim 1, wherein the first dummy electrode and the second dummy electrode are disposed along 80% or more of sides constituting an outer shape of the element structure layer.

15. The semiconductor optical device of claim 1, wherein, when viewed from above the element structure layer, the first region includes a first end side region intersecting the first direction in which the first dummy electrode is not disposed, and the second region includes a second end side region intersecting the first direction in which the second dummy electrode is not disposed.

16. The semiconductor optical device of claim 1, wherein, when viewed from above the element structure layer, the element structure layer has a rectangular outer shape, at least a part of the first dummy electrode and the second dummy electrode is disposed along four corners of the rectangular outer shape, and an upper surface of the first dummy electrode and an upper surface of the second dummy electrode are physically positioned at a position higher than an upper surface of the electrode film.

17. The semiconductor optical device of claim 1, wherein, when viewed from above the element structure layer, a layer structure of the element structure layer in a region overlapping the first dummy electrode is equal to a layer structure of the element structure layer in a region overlapping the second dummy electrode.

18. An optical module comprising:
   the semiconductor optical device according to claim 1; and
   a submount on which a lower surface side of the semiconductor optical device is mounted,
      wherein wiring provided in the submount and the electrode pad portion are electrically connected by wire bonding.

19. A method of manufacturing a semiconductor optical device comprising:
   preparing an element structure layer including a mesa stripe extending in a first direction; and
   forming a conductive layer on an upper surface of the element structure layer, such that:
      an electrode film covers at least an upper surface of the mesa stripe,
      an electrode pad portion covers a part of a first region positioned in a second direction, intersecting the first direction, relative to the mesa stripe on an upper surface of the element structure layer and is electrically connected to the electrode film,
      a first dummy electrode covers another part of the first region and is electrically insulated from the electrode film, and
      a second dummy electrode covers at least a part of a second region positioned in a third direction, opposite to the second direction, relative to the mesa stripe on the upper surface of the element structure layer and is electrically insulated from the electrode film,
         wherein the first dummy electrode includes a first portion disposed in the first direction relative to the electrode pad portion and a second portion disposed in a fourth direction, opposite to the first direction, relative to the electrode pad portion, and
         wherein a gap between the first dummy electrode and the electrode pad portion has a depth that ends at an uppermost surface of the upper surface of the element structure layer.

20. The method of claim 19, wherein the conductive layer is formed using milling.

* * * * *